(12) United States Patent
Chang et al.

(10) Patent No.: US 8,178,437 B2
(45) Date of Patent: May 15, 2012

(54) BARRIER MATERIAL AND PROCESS FOR CU INTERCONNECT

(75) Inventors: Chung-Liang Chang, Hsinchu (TW); Ching-Hua Hsieh, Hsinchu (TW); Shau-Lin Shue, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/181,770

(22) Filed: Jul. 29, 2008

(65) Prior Publication Data

US 2008/0280432 A1  Nov. 13, 2008

Related U.S. Application Data

(62) Division of application No. 11/001,471, filed on Dec. 1, 2004, now abandoned.

(51) Int. Cl.
*H01L 21/4763* (2006.01)
(52) U.S. Cl. ........ 438/627; 438/626; 438/622; 257/751; 257/E21.495
(58) Field of Classification Search ........... 257/627.751, 257/E21.495, 627; 438/627, 622, 626
See application file for complete search history.

(56) References Cited

U.S. PATENT DOCUMENTS

| | | | |
|---|---|---|---|
| 5,604,156 A * | 2/1997 | Chung et al. ................ | 438/620 |
| 5,817,572 A | 10/1998 | Chiang et al. | |
| 5,913,147 A * | 6/1999 | Dubin et al. ................ | 438/687 |
| 6,111,301 A | 8/2000 | Stamper | |
| 6,114,242 A | 9/2000 | Sun et al. | |
| 6,242,349 B1 * | 6/2001 | Nogami et al. .............. | 438/687 |
| 6,248,665 B1 | 6/2001 | Bao et al. | |
| 6,249,055 B1 * | 6/2001 | Dubin .......................... | 257/758 |
| 6,251,786 B1 * | 6/2001 | Zhou et al. ................... | 438/692 |
| 6,323,554 B1 * | 11/2001 | Joshi et al. ................... | 257/758 |
| 6,359,160 B1 | 3/2002 | Sun et al. | |
| 6,465,888 B2 | 10/2002 | Chooi et al. | |
| 6,495,449 B1 | 12/2002 | Nguyen | |
| 6,541,367 B1 * | 4/2003 | Mandal ......................... | 438/622 |
| 6,541,842 B2 * | 4/2003 | Meynen et al. .............. | 257/632 |
| 6,670,266 B2 | 12/2003 | Nguyen et al. | |
| 6,713,373 B1 | 3/2004 | Omstead | |
| 6,753,607 B1 | 6/2004 | Wu et al. | |

(Continued)

OTHER PUBLICATIONS

Choi, S.-M., et al., "Process Integration of CVD Cu Seed Using ALD Ru Glue Layer for Sub-65nm Cu Interconnect," 2004 Symposium on VLSI Technology Digest of Technical Papers (2004), IEEE, pp. 64-65.

(Continued)

*Primary Examiner* — Bradley K Smith
*Assistant Examiner* — Mohammad T Karimy
(74) *Attorney, Agent, or Firm* — Slater & Matsil, L.L.P.

(57) ABSTRACT

A semiconductor diffusion barrier layer and its method of manufacture is described. The barrier layer includes of at least one layer of TaN, TiN, WN, TbN, VN, ZrN, CrN, WC, WN, WCN, NbN, AlN, and combinations thereof. The barrier layer may further include a metal rich surface. Embodiments preferably include a glue layer about 10 to 500 Angstroms thick, the glue layer consisting of Ru, Ta, Ti, W, Co, Ni, Al, Nb, AlCu, and a metal-rich nitride, and combinations thereof. The ratio of the glue layer thickness to the barrier layer thickness is preferably about 1 to 50. Other alternative preferred embodiments further include a conductor annealing step. The various layers may be deposited using PVD, CVD, PECVD, PEALD and/or ALD methods including nitridation and silicidation methods.

19 Claims, 4 Drawing Sheets

U.S. PATENT DOCUMENTS

| | | |
|---|---|---|
| 6,963,139 B2 | 11/2005 | Kishida et al. |
| 2001/0041250 A1* | 11/2001 | Werkhoven et al. ........... 428/212 |
| 2002/0158338 A1* | 10/2002 | Ohtsuka et al. ............... 257/758 |
| 2002/0171147 A1 | 11/2002 | Yew et al. |
| 2003/0001266 A1 | 1/2003 | Hu |
| 2004/0063310 A1* | 4/2004 | Ngo et al. ..................... 438/637 |
| 2004/0106277 A1* | 6/2004 | Shen ............................. 438/623 |
| 2004/0121583 A1 | 6/2004 | Bao et al. |
| 2004/0152333 A1 | 8/2004 | Zhao et al. |

OTHER PUBLICATIONS

Goswami, I., et al., "Transition Metals Show Promise as Copper Barriers," Semiconductor International (May 1, 2004) 6 pages.

Ho, P., et al., "ALD/PVD Barrier Reduces RC and Improves Reliability," Semiconductor International (Jun. 1, 2004) 6 pages.

* cited by examiner

BARRIER MATERIAL AND PROCESS FOR CU INTERCONNECT

This application is a divisional of U.S. application Ser. No. 11/001,471, filed Dec. 1, 2004 now abandoned, entitled "Barrier Material and Process for Cu Interconnect," which application is hereby incorporated herein by reference.

TECHNICAL FIELD

This invention relates generally to semiconductor device fabrication and more particularly to a structure and method for improved resistance to electromigration problems with conductive lines and vias, such as copper, between interconnected layers.

BACKGROUND

In modern integrated circuits, minimum feature sizes, such as the channel length of field effect transistors, have reached the deep sub-micron range, thereby steadily increasing performance of these circuits in terms of speed and power consumption. As the size of the individual circuit elements is reduced, so is the available real estate for conductive interconnects in integrated circuits. Consequently, these interconnects have to be reduced to compensate for a reduced amount of available real estate and for an increased number of circuit elements provided per chip.

In integrated circuits having minimum dimensions of approximately 0.35 μm and less, a limiting factor of device performance is the signal propagation delay caused by the switching speed of the transistor elements. As the channel length of these transistor elements has now reached 0.18 μm and less, however, capacitance between neighboring conductive structures is increasingly problematic. Parasitic RC time constants therefore require the introduction of a new materials and methods for forming metallization layers.

Traditionally, metallization layers are formed by a dielectric layer stack including, for example, silicon dioxide and/or silicon nitride with aluminum as the typical metal. Since aluminum exhibits significant electromigration at higher current densities, copper is replacing aluminum. Copper has significantly lower electrical resistance and reduced electromigration problems.

The introduction of copper, however, entails a plurality of issues to be dealt with. For example, copper may not be deposited in higher amounts in an efficient manner by well-established deposition methods, such as chemical and physical vapor deposition. Moreover, copper may not be efficiently patterned by well-established anisotropic etch processes and therefore the so-called damascene technique is employed in forming metallization layers including copper lines. Typically, in the damascene technique, the dielectric layer is deposited and then patterned with trenches and vias that are subsequently filled with copper by plating methods, such as electroplating or electroless plating.

A further issue is the ability of copper to readily diffuse in silicon dioxide. Therefore, copper diffusion may negatively affect device performance, or may even lead to a complete failure of the device. It is therefore necessary to provide a diffusion barrier layer between the copper surfaces and the neighboring materials to substantially prevent copper from migrating to sensitive device regions. Silicon nitride is known as an effective copper diffusion barrier, and is thus frequently used as a dielectric barrier material separating a copper surface from an interlayer dielectric, such as silicon dioxide.

Although copper exhibits superior characteristics with respect to resistance to electromigration compared to aluminum, the ongoing shrinkage of feature sizes, however, leads to increased current densities, thereby causing a non-acceptable degree of electromigration. Electromigration is a diffusion phenomenon occurring under the influence of an electric field, which leads to copper diffusion in the direction of the moving charge carriers. This can produce voids in the copper lines that may cause device failure. It has been confirmed that these voids typically originate at the copper silicon nitride interface and represent one of the most dominant diffusion paths in copper metallization structures. It is therefore of great importance to produce high quality interfaces between the copper and the diffusion barrier layer to reduce the electromigration to an acceptable degree.

As previously noted, the device performance of extremely scaled integrated circuits is substantially limited by the parasitic capacitances of adjacent interconnect lines, which may be reduced by decreasing the resistivity thereof and by decreasing the capacitive coupling in that the overall dielectric constant of the dielectric layer is maintained as low as possible. Since silicon nitride has a relatively high dielectric constant k of approximately 7 compared to silicon dioxide ($k \approx 4$) or other silicon dioxide based low-k dielectric layers ($k<4$), it is generally preferable to form the silicon nitride layer with a minimum thickness. It turns out, however, that the barrier characteristics of the silicon nitride layer depend on the thickness thereof so that thinning the silicon nitride layer, as would be desirable for a reduced overall dielectric constant, may not be practical to an extent as required for further scaling semiconductor devices including copper metallization layers without compromising device performance.

In light of the above-specified problems, a need exists for diffusion barrier layers exhibiting an improvement with respect to diffusion barrier efficiency, resistance to electromigration, lower parasitic capacitance, and other problems.

SUMMARY OF THE INVENTION

These and other problems are generally solved or circumvented, and technical advantages are generally achieved, by preferred embodiments of the present invention, in which improved structures and methods relating to copper diffusion barriers yield devices having enhanced electromigration performance.

In accordance with an embodiment of the present invention, a method of reducing electromigration effects in a damascene device comprises forming a low-k dielectric layer having a recessed feature and forming a diffusion barrier layer over the surface of the low-k dielectric layer. A glue layer is formed upon the diffusion barrier layer and the recessed feature is filled with a conductor. The conductor is annealed and a cap layer is formed upon the conductor.

In accordance with another embodiment of the present invention, a method for forming a semiconductor device comprises providing a substrate including a low-k dielectric layer with an opening. A pore sealing process is performed and a barrier layer is formed within the opening. A glue layer is formed on the barrier layer and a seed layer is formed on the glue layer. A conductor is formed on the seed layer and a cap layer is formed on the conductor.

In accordance with yet another embodiment of the present invention, a method of forming a semiconductor device comprises providing a low-k dielectric layer with a recessed feature and forming a diffusion barrier layer on the surface of the low-k dielectric layer. A glue layer is formed on the diffusion barrier layer and a conductor is formed on the glue layer. The conductor is annealed and a cap layer is formed over the conductor.

Additional features and advantages of embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The operation and fabrication of the presently preferred embodiments are discussed in detail below. However, the embodiments and examples described herein are not the only applications or uses contemplated for the invention. The specific embodiments discussed are merely illustrative of specific ways to make and use the invention, and do not limit the scope of the invention or the appended claims.

This invention relates generally to semiconductor device fabrication and more particularly to a structure and method for improved resistance to electromigration problems with conductive lines and vias, such as copper, between interconnected layers. The present invention will now be described with respect to preferred embodiments in a specific context, namely the creation of copper conductive lines and vias in the damascene process. It is believed that embodiments of this invention are particularly advantageous when used in this process. It is further believed that embodiments of this invention are advantageous when used in other semiconductor fabrication applications wherein diffusion barriers and electromigration, for example, are a concern. It is further believed that embodiments described herein will benefit other integrated circuit interconnection applications not specifically mentioned. Therefore, the specific embodiments discussed are merely illustrative of specific ways to make and use the invention, and do not limit the scope of the invention.

Figure 1:
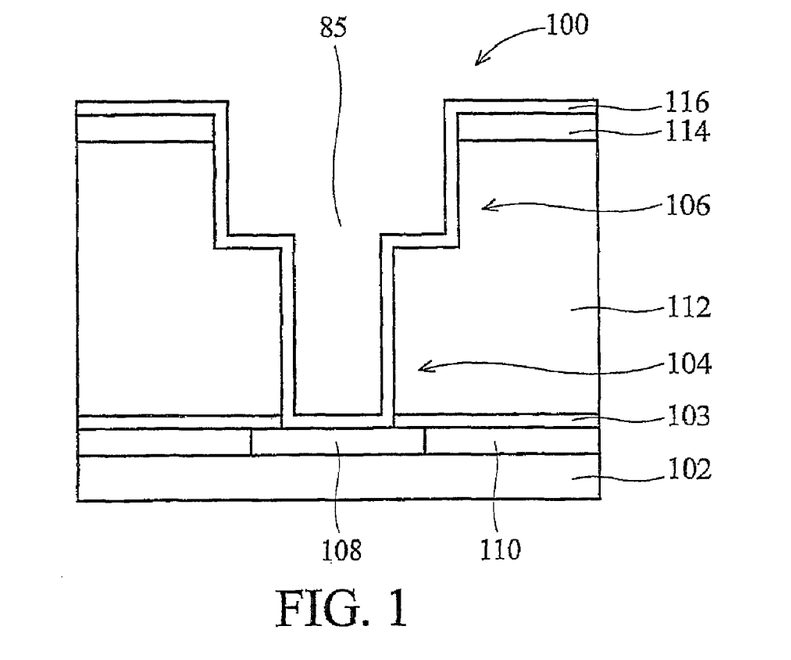
FIG. 1 is a cross sectional view of a semiconductor device at an intermediate step in an exemplary damascene process further illustrating a barrier layer according to preferred embodiments.

Referring now to FIG. 1, there is shown a cross section of the representative intermediate damascene structure 100 created in the surface of a semiconductor substrate 102 that is to be treated in accordance with an exemplary damascene process and embodiments of the invention. The substrate 102 may comprise, for example, functional and logical devices, or it may comprise other interconnected layers. The details of the damascene process are described by Bao et al. in U.S. Pat. No. 6,248,665 and in U.S. patent publication 2004/0121583, both of which are hereby incorporated by reference.

Referring to FIG. 1, in an exemplary application of the present invention, there is shown a cross sectional, side view representation of a portion of a semiconductor device having a semiconductor wafer with an anisotropically etched, intermediate, dual damascene structure 100. Within the intermediate damascene structure 100 is a recessed feature 85 having a via portion 104 and an overlying trench line portion 106. While there are several ways to form a dual damascene structure, one approach involves at least two photolithographic patterning and anisotropic etching steps to first form via openings 104 followed by a similar process to form overlying trench line openings 106 encompassing one or more via openings 104.

Still referring to FIG. 1, a first etch stop layer 103, formed of, for example silicon nitride ($Si_3N_4$), is provided over a conductive region 108, for example a copper damascene structure formed in an underlying dielectric insulating layer 110. In accordance with the conventional damascene process, the word copper is known to include suitable copper alloys. Overlying the first etch stop layer 103 is another insulating dielectric layer 112, also referred to as an inter-metal dielectric (IMD) layer.

For example, the IMD layer 112 is a low-k (i.e. k less than about 4) dielectric, for example a carbon doped silicon dioxide, also referred to as organo silicate glass (OSG) and C-oxide. In alternative embodiments, low-k materials may include borophosphosilicate glass (BPSG), borosilicate glass (BSG), phosphosilicate glass (PSG), deposited over the surface of the semiconductor structures to a thickness of between about 5000 to 9000 Angstroms and preferably planarized. Exemplary organic low-k materials include polyarylene ether, hydrogen silesquioxane (HSQ), methyl silsesquioxane (MSQ), polysilsequioxane, polyimide, benzocyclbbutene, and amorphous Teflon. Other types of low-k materials suitably used with the method of the present invention include fluorinated silicate glass (FSG) and porous oxides. In preferred embodiments, the dielectric layer is preferably a low-k material containing C, O, Si, and F, such as fluorine-doped —(O—Si($CH_3$)$_2$-O)—.

Open pores in low-k materials, e.g. IMD layer 112, are known to degrade performance. Therefore embodiments include a pore-sealing method comprising plasma pore sealing using Ar and $NH_3$, e-beam pore sealing, metal organic pore sealing, or preferably vapor pore sealing. In preferred embodiments, a low-k surface is subjected to treatment with 4MS (tetramethylsilane) at a temperature of about 400° C. The 4MS used in the treatment of the present invention can be replaced by trimethylsilane, dimethylsilane or methylsilane. The vapor can be composed of organic or metal-organic molecules, preferably having a size larger than 10 Å. The temperature ranges from about 350-450° C. for about 5-30 seconds.

The e-beam pore sealing employs an electron beam with a typical condition of 2000~5000 keV, 1~6 mA, and 75~100

μC/cm2. Plasma pore sealing uses an Ar plasma to bombard the low-k surface to block the pores of the sidewall of the dual damascene.

Still referring to FIG. 1, overlying the IMD layer 112 is formed an IMD covering dielectric layer, for example an etch stop layer 114. The etch stop layer 114 may include, for example, silicon nitride and/or silicon oxynitride (SiON), which may function as both an etching stop and anti-reflectance coating (ARC) layer. The etch stop layer 114 is preferably from about 500 Angstroms to about 1500 Angstroms in thickness.

The dual damascene structure 100 is formed by first sequentially photolithographically patterning and anisotropically etching the via opening 104 through the etch stop layer 114, the IMD layer 112, and at least partially through the first etch stop layer 103. This is followed by a similar process to photolithographically pattern and anisotropically etch a trench opening 106 through the etch stop layer 114 and a portion of the IMD layer 112. These steps form a trench opening 106 overlying and encompassing the via opening 104. It will be appreciated that the trench opening 106 may encompass one or more via openings 104 and that the trench opening 106 and via opening 104 may be formed in separate stacked IMD layers 112 including another etch stop layer 114 formed between the respective IMD layers.

Still referring to FIG. 1, a barrier layer 116 is blanket deposited to line at least the dual damascene feature opening. The barrier layer is preferably about 10 to 30 Angstroms thick, and it forms a barrier for Cu diffusion. The barrier layer 116 may include a metal nitride such as TaN, TiN, WN, TbN, VN, ZrN, CrN, WC, WN, WCN, NbN, AlN, and combinations thereof. In alternative embodiments the barrier layer 116 is metal rich, either throughout the bulk or only on the surface. In metal-rich, barrier layers, the ratio of nitrogen to metal is preferably less than about one (atomic ratio).

In alternative preferred embodiments, the barrier layer includes a first barrier layer on the surface of the low-k dielectric layer and a second barrier layer on the first barrier layer. The first barrier layer includes an atomic layer deposited (ALD) material selected from the group consisting essentially of Ta, W, and combinations thereof. The second barrier layer is selected from the group consisting essentially of Ni, Co, Al, AlCu alloy, W, Ti, Ta, Ra, Ru, and combinations thereof. An optional Cu seed layer may be deposited on the second barrier layer.

The barrier layer 116 may be applied using physical vapor deposition (PVD), chemical vapor deposition (CVD), plasma enhanced chemical vapor deposition (PECVD), or plasma enhanced atomic layer deposition (PEALD). In preferred embodiments, the barrier layer 116 comprises TaN, and it is deposited using atomic layer deposition (ALD).

An ALD deposited, TaN barrier layer 116 is particularly advantageous in forming a damascene structure with reduced capacitance and reduced electromigration effects. As semiconductor dimensions continue to shrink, capacitance between conductive structures is increasingly problematic. Applicants have found that ALD barrier 116 deposition is more preferred than, for example, PVD. In the preferred embodiment comprising a TaN barrier 116, for example, applicants found that ALD significantly reduces the parasitic capacitance between neighboring conductive structures by as much as 11.5%, as compared to PVD. An ALD deposited barrier, therefore, enables thinner metal lines because the metal line with ALD barrier has a lower effective resisitvity.

In still other embodiments, the barrier layer 116 includes a Ta/TaN bi-layer structure. Ta/TaN bilayer embodiments include: PEALD TaN and ALD Ta, ALD TaN and PEALD Ta, or PEALD TaN and PEALD Ta.

Figure 2:
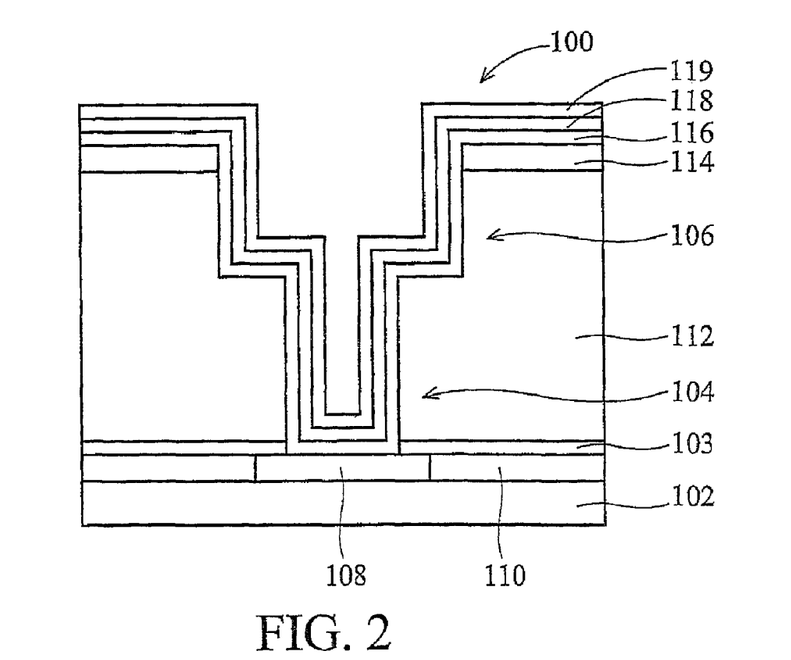
FIG. 2 is a cross-sectional view showing a preferred embodiment that includes barrier, glue, and seed layers.

As shown in FIG. 2, preferred embodiments contain a glue layer 118 between the barrier layer 116 and an overlaying conductor (described below, see FIG. 3, 120). Glue layer 118 enhances adhesion between and adjacent layers. The glue layer 118 preferably contains materials that bond with copper and/or the underlying barrier layer. It may be about 10 to 500 Angstroms thick, preferably less than about 150 Å. It is also preferably metal-rich.

In alternative embodiments, the glue layer 118 preferably comprises two layers (not specifically shown). The first layer is preferably a metal-rich thin layer from about 130 to 170 Angstroms, preferably about 150 Angstroms. The second layer is stoichiometric metal nitride layer about 500 to 600 Angstroms, preferably about 550 Angstroms. The glue layer 118 may be applied using PVD, CVD, PECVD, PEALD, and, preferably, ALD at a deposition rate less than about 1 A/sec at about 100-300° C.

Alternative embodiments include a glue layer 118 consisting of Ru, Ta, Ti, W, Co, Ni, Al, Nb, AlCu alloy, and combinations thereof. In preferred embodiments, the ratio of the glue layer 118 thickness to the barrier layer 116 thickness is about 1 to 50.

Prior to deposition of a conductor, a seed layer 119 is optionally deposited over the glue layer 118 by, for example, PVD and/or CVD. Seed layer 119, preferably copper, is PVD deposited to form a continuous layer about 400 to 700 Å thick over the wafer process surface, thereby providing a continuously conductive surface for forming the bulk of the copper during the ECD process.

Still referring to FIG. 2, the embodiment summarized therein is preferably annealed at about 300° C. for about 1 minute. Annealing advantageously lowers the effective resistivity of the barrier/glue/seed stack. Typically glue layers that include Ta and Co exhibit the most improvement.

In other embodiments of the present invention, there is an alternative method to improve adhesion between the barrier layer and adjacent layers. The deposition of the barrier layer, as described above, may further include a thermal treatment such as electron beam annealing or rapid thermal processing, RTP. Preferred treatments advantageously enhance wetability and/or adhesion between the barrier layer and the copper layer.

The thermal adhesion process is preferably performed at an intermediate stage during the ALD deposition of the barrier. Typically, barrier formation such as ALD TaN includes multiple steps. First, a Ta precursor is used to form a saturated surface layer. Next, the saturated surface layer is reduced and nitrided using NH3 to form a $Ta_xN_y$ monolayer. The thermal adhesion treatment occurs between these two steps. In the case of a WCN barrier, which is a three-step deposition process, the thermal adhesion is performed prior to the reduction step. The RTP may be incorporated into the ALD chamber. A typical RTP temperature is about 200 to 400° C.

Figure 3:
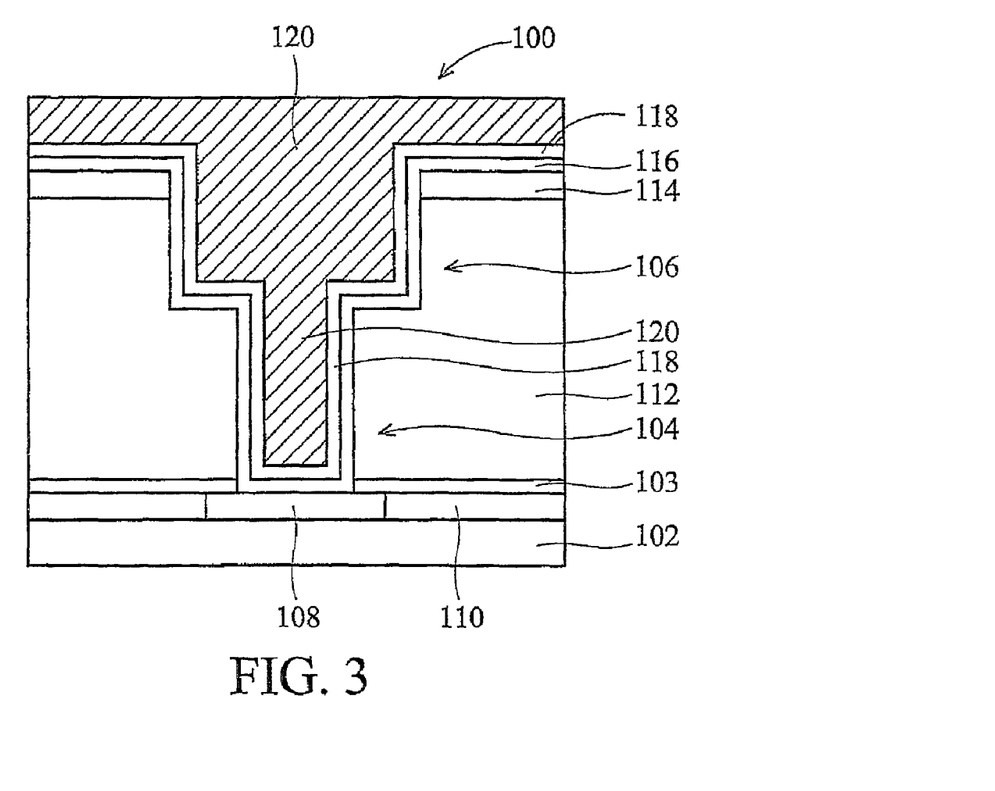
FIG. 3 is a cross-sectional view showing a conductor deposited on the glue layer according to preferred embodiments.

Referring to FIG. 3, following deposition of glue layer 118, a conductor 120, preferably copper, is electroplated according to a conventional electro-chemical deposition (ECD) process to fill the dual damascene trench 106 and via 104 including an overlying portion above the trench level. In alternative embodiments, a seed layer (not shown) is between glue layer 118 and conductor 120. Although other copper filling methods, such as PVD and CVD, may be used, electroplating (electrodeposition) is preferred because of its superior gap-filling and step coverage. Alternative embodiments may include the conductor 120 comprising at least one of Cu, Al, Au, or Ag, and combinations thereof, or alloyed compositions thereof.

Figure 4:
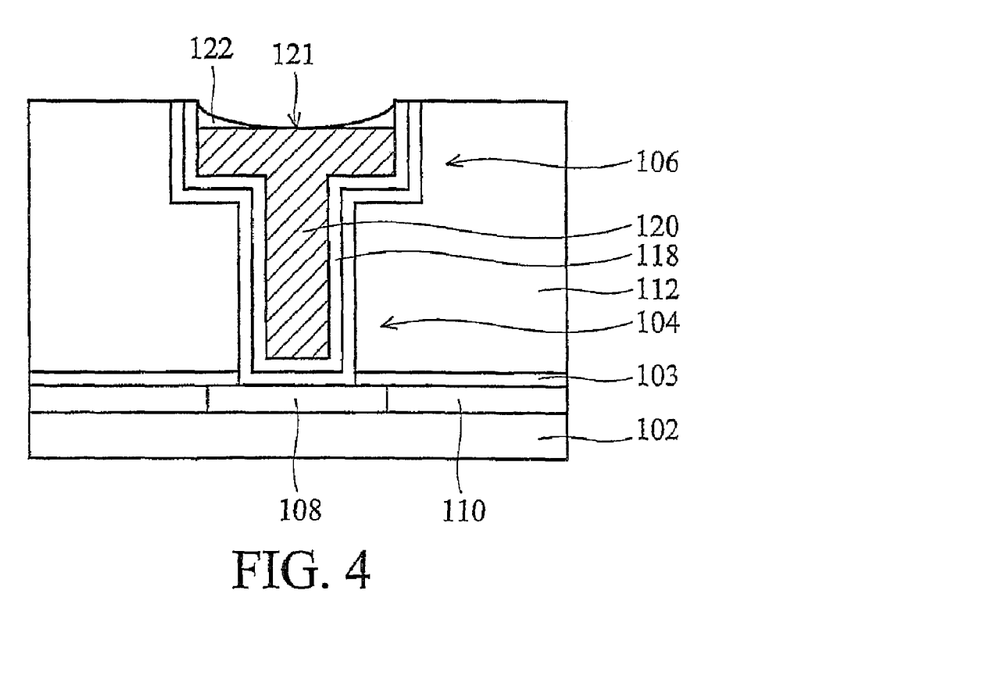
FIG. 4 is a cross-sectional view showing CMP planarization according to preferred embodiments.

A chemical mechanical polishing (CMP) may be used to polish the conductor fill to the level of the feature. In another alternative, electropolishing or overburden reduction may be used in place of CMP or serially with CMP. In the alternative, a simultaneous CMP and plating process may be performed. As shown in FIG. 4, the CMP process forms a recessed area 121 due to preferential removal of the softer conductor 120.

Referring still to FIG. 4, in another embodiment, an upper portion 122 of the recessed conductor is removed. The depth of the recessed area 121 is increased by first oxidizing the upper portion 122 of the exposed conductor, e.g. copper, followed by another CMP step or wet etching step to remove the oxidized upper portion 122 of the copper feature.

Following CMP planarization, alternative preferred embodiments include a seed layer (not shown) and conductor 120 anneal. Preferably, the annealing step is performed at about 150 to 450° C., for about 0.5 to 5 minutes, in $N_2/H_2$ forming gas. The anneal causes metals in the seed layer to migrate or diffuse throughout the copper fill layer (120), thereby forming a copper-metal fill layer (120). Preferably, the Cu seed layer includes titanium. Annealing advantageously causes the Ti to distribute approximately uniformly within conductor layer 120 and form a uniform copper-titanium fill layer (120). The anneal also causes granularity of the surface of the conductor layer 120 and results in improved adhesion between the conductor layer 120 and a cap layer (as shown in FIG. 5) that is deposited over this surface.

Figure 5:
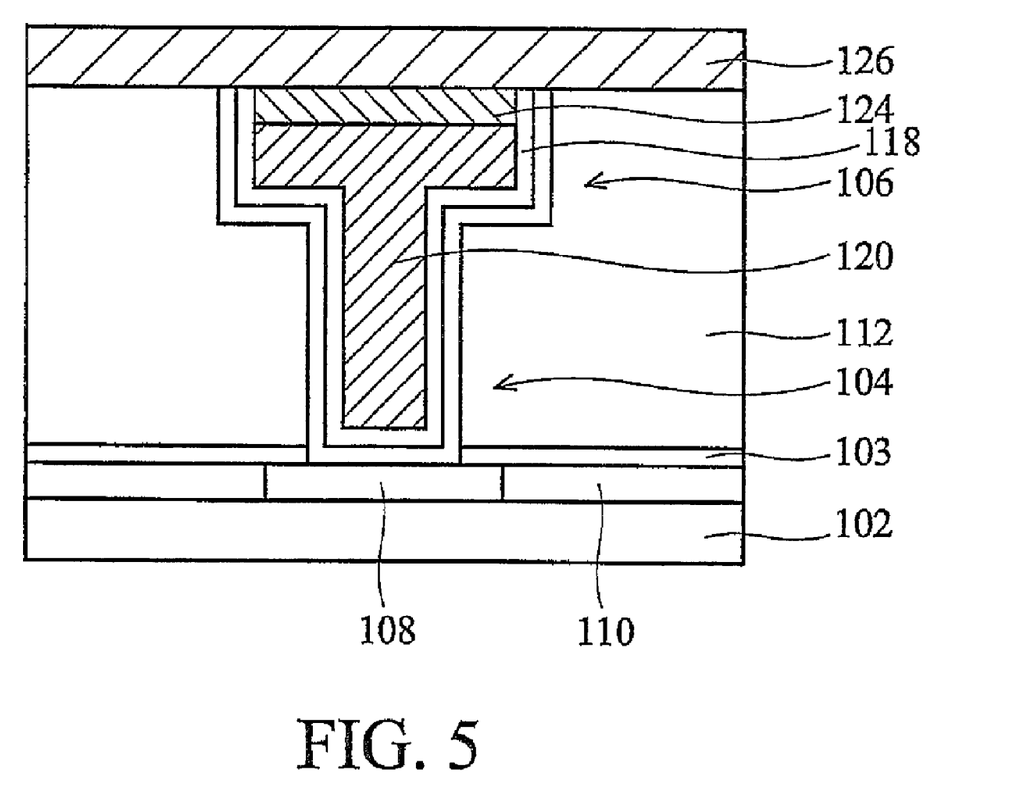
FIG. 5 cross-sectional view showing a cap layer according to preferred embodiments.

Referring to FIG. 5, in an embodiment of the present invention, following the CMP, a cap layer 124 is deposited over the damascene structure. The cap layer 124 is preferably deposited to a thickness of about 50 Angstroms to about 500 Angstroms. The cap layer 124 is preferably sufficiently thick to avoid copper diffusion. It is deposited by conventional ALD, PVD, PECVD, PEALD, and/or CVD methods, including nitridation and silicidation methods known in the art. The cap layer 124 preferably includes at least one layer of W, Al, Ta, Ti, Ni, Ru, or nitrides thereof. Preferred embodiments include a Co or nitride-Co cap layer deposited by CVD or ALD.

Still other embodiments may include a cap layer comprising at least one layer of a carbon-containing dielectric (such as SiC, SiOC, SiCN), a nitrogen-containing dielectric, a nitrogen-containing conductive layer, or a silicon-containing layer.

Returning to FIG. 5, following the CMP and capping processes, an etch stop layer 126 of silicon nitride may be deposited over the process wafer surface including over the barrier capping layer overlying the copper feature.

Figure 6:
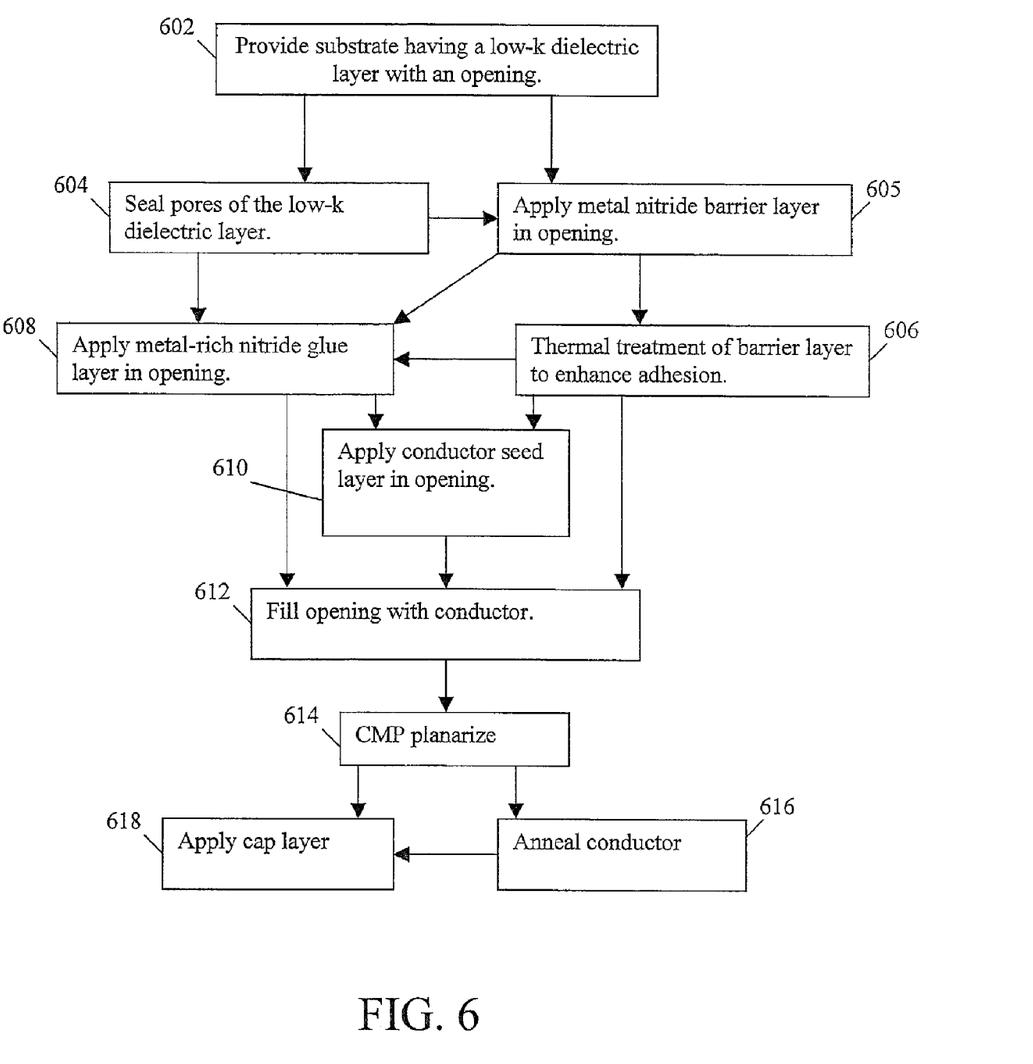
FIG. 6 is a process flow diagram according to several embodiments of the present invention.

Referring now to FIG. 6, there is shown a process flow diagram including several of the preferred embodiments of the present invention. In process 602, a substrate is provided, and within the substrate a feature opening is formed in a low-k dielectric insulating layer (ILD). In process 604, the pores of the low-k dielectric are sealed. In process 605, the feature opening is lined with a metal nitride barrier layer. In process 606, the barrier layer is treated to enhance adhesion. In process 608, a metal-rich nitride glue layer is applied. In process 610, a Cu seed layer is applied. In process 612, the feature opening is filled with a conductor. In process 614, the structure is CMP planarized. In process 616, the conductor is annealed. In process 618, a cap layer is applied.

The embodiments of the invention described above are exemplary and not limiting, and variations that are apparent to those skilled in the art that include the features of the invention are within the scope of the invention and the appended claims. Although embodiments of the present invention and their advantages have been described in detail, it should be understood that various changes, substitutions and alterations can be made herein without departing from the spirit and scope of the invention as defined by the appended claims.

For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of reducing electromigration effects in a copper damascene device, the method comprising:
    forming a low-k dielectric layer, the low-k dielectric layer having a surface with a recessed feature;
    forming a diffusion barrier layer over the surface of the low-k dielectric layer, wherein the forming the diffusion barrier layer further comprising forming a barrier layer material and thermally treating the barrier layer material;
    forming a glue layer on the diffusion barrier layer after the forming the diffusion barrier layer;
    filling the recessed feature with a conductor;
    annealing the conductor; and
    depositing a cap layer on the conductor, wherein a top surface of the cap layer is coplanar with a top surface of the glue layer.

2. The method of claim 1, wherein the cap layer consists essentially of a material selected from the group consisting of Co, W, Al, Ta, Ti, Ni, Ru, and combinations thereof.

3. The method of claim 1, wherein the diffusion barrier layer consists essentially of a material selected from the group consisting of TaN, TiN, WN, TbN, VN, ZrN, CrN, WC, WN, WCN, NbN, AlN, and combinations thereof.

4. The method of claim 1, wherein the diffusion barrier layer is about 10 to 30 Angstroms.

5. The method of claim 1, wherein the cap layer consists essentially of a material selected from the group consisting of a carbon-containing dielectric, a nitrogen-containing dielectric, a nitrogen-containing conductor, a silicon-containing conductive layer, silicon, and combinations thereof.

6. The method of claim 1, wherein the glue layer consists essentially of a material selected from the group consisting of a metal-rich nitride, Ru, Ta, Ti, W, Co, Ni, Al, Nb, AlCu, and combinations thereof.

7. The method of claim 6, wherein the metal-rich nitride comprises TaN and wherein an atomic ratio of nitrogen to tantalum is less than about 1.

8. The method claim 1, wherein a thickness ratio of the glue layer to the diffusion barrier layer is about 1 to 50.

9. The method of claim 1, wherein the diffusion barrier layer is deposited using physical vapor deposition (PVD), chemical vapor deposition (CVD), plasma enhanced chemical vapor deposition (PECVD), or plasma enhanced atomic layer deposition (PEALD).

10. The method of claim 1, wherein the cap layer is deposited using physical vapor deposition (PVD), chemical vapor deposition (CVD), plasma enhanced chemical vapor deposition (PECVD), or plasma enhanced atomic layer deposition (PEALD).

11. A method for forming a semiconductor device, the method comprising:
   providing a substrate, the substrate including a low-k dielectric layer with an opening;
   performing a pore sealing process;
   forming a barrier layer within the opening;
   forming a glue layer on the barrier layer;
   forming a seed layer on the glue layer, the seed layer comprising a first material;
   forming a conductor on the seed layer, the forming a conductor on the seed layer further comprising:
      forming a second material different from the first material; and
      annealing the second material and the first material to diffuse at least a portion of the first material from the seed layer throughout the second material; and
   forming a cap layer on the conductor such that the cap layer in only on the conductor, the cap layer being free from oxygen.

12. The method of claim 11, wherein the cap layer consists essentially of a material selected from the group consisting of Co, W, Al, Ta, Ti, Ni, Ru, and combinations thereof.

13. The method of claim 11, wherein the barrier layer consists essentially of a material selected from the group consisting of TaN, TiN, WN, TbN, VN, ZrN, CrN, WC, WN, WCN, NbN, AlN, and combinations thereof.

14. The method of claim 11, wherein the cap layer consists essentially of a material selected from the group consisting of a carbon-containing dielectric, a nitrogen-containing dielectric, a nitrogen-containing conductor, a silicon-containing conductive layer, and silicon, and combinations thereof.

15. The method of claim 11, wherein the glue layer consists essentially of a material selected from the group consisting of a metal-rich nitride, Ru, Ta, Ti, W, Co, Ni, Al, Nb, AlCu, and combinations thereof.

16. The method of claim 11, further comprising annealing the conductor at about 150 to 450° C. for about 0.5 to 5 minutes in forming gas.

17. A method of forming a semiconductor device, the method comprising:
   providing a low-k dielectric layer with a recessed feature;
   performing a pore sealing process;
   depositing a diffusion barrier layer on the surface of the low-k dielectric layer, the forming the diffusion barrier layer being performed separately from the performing the pore sealing process;
   forming a glue layer on the diffusion barrier layer;
   forming a conductor on the glue layer;
   recessing the conductor into the recessed feature;
   annealing the conductor after recessing the conductor; and
   forming a cap layer over the conductor.

18. The method of claim 17, wherein the cap layer consists essentially of a material selected from the group consisting of Co, W, Al, Ta, Ti, Ni, Ru, and combinations thereof.

19. The method of claim 17, wherein the diffusion barrier layer consists essentially of a material selected from the group consisting of TaN, TiN, WN, TbN, VN, ZrN, CrN, WC, WN, WCN, NbN, AlN, and combinations thereof.

* * * * *